United States Patent
Jung

(10) Patent No.: US 9,567,490 B2
(45) Date of Patent: Feb. 14, 2017

(54) POLISHING SLURRY AND SUBSTRATE POLISHING METHOD USING THE SAME

(71) Applicant: UBMATERIALS INC., Yongin-Si, Gyeonggi-do (KR)

(72) Inventor: Seung Won Jung, Anyang-Si (KR)

(73) Assignee: UBMATERIALS INC. (KR)

( * ) Notice: Subject to any disclaimer, the term of this patent is extended or adjusted under 35 U.S.C. 154(b) by 0 days.

(21) Appl. No.: 14/519,122

(22) Filed: Oct. 20, 2014

(65) Prior Publication Data

US 2015/0184028 A1    Jul. 2, 2015

(30) Foreign Application Priority Data

Dec. 27, 2013  (KR) .................. 10-2013-0165582

(51) Int. Cl.

| | |
|---|---|
| C09K 13/00 | (2006.01) |
| C09K 13/02 | (2006.01) |
| H01L 21/302 | (2006.01) |
| H01L 21/461 | (2006.01) |
| B44C 1/22 | (2006.01) |
| C03C 15/00 | (2006.01) |
| C03C 25/68 | (2006.01) |
| C09G 1/02 | (2006.01) |
| H01L 21/321 | (2006.01) |
| C09K 3/14 | (2006.01) |
| H01L 21/304 | (2006.01) |
| C23F 3/06 | (2006.01) |

(52) U.S. Cl.
CPC ............... *C09G 1/02* (2013.01); *C09K 3/1454* (2013.01); *C09K 3/1463* (2013.01); *C23F 3/06* (2013.01); *H01L 21/304* (2013.01); *H01L 21/3212* (2013.01)

(58) Field of Classification Search
None
See application file for complete search history.

(56) References Cited

U.S. PATENT DOCUMENTS

| | | | | |
|---|---|---|---|---|
| 5,958,288 | A * | 9/1999 | Mueller ................... | C09G 1/02 216/53 |
| 2002/0095872 | A1* | 7/2002 | Tsuchiya et al. ............... | 51/307 |
| 2004/0092106 | A1* | 5/2004 | Martyak et al. .............. | 438/689 |
| 2005/0266689 | A1* | 12/2005 | Small et al. .................. | 438/693 |
| 2006/0096179 | A1 | 5/2006 | Lu et al. | |
| 2010/0075501 | A1* | 3/2010 | Abe ...................... | C09K 3/1463 438/693 |
| 2012/0171936 | A1* | 7/2012 | Haerle et al. ................... | 451/59 |

FOREIGN PATENT DOCUMENTS

| | | |
|---|---|---|
| CN | 1185472 A | 6/1998 |
| CN | 1969024 A | 5/2007 |
| CN | 101511607 A | 8/2009 |
| JP | 10265766 A | 10/1998 |
| JP | 2000173959 A | 6/2000 |
| JP | 2005523574 A | 8/2005 |

(Continued)

*Primary Examiner* — Stephanie Duclair

(57) ABSTRACT

A polishing slurry for tungsten and a substrate polishing method are disclosed. The polishing slurry includes an abrasive for performing polishing and having positive zeta potential, and a potential modulator for promoting the oxidation of the tungsten and for controlling the zeta potential of the abrasive.

20 Claims, 15 Drawing Sheets

(4 of 15 Drawing Sheet(s) Filed in Color)

(56) References Cited

FOREIGN PATENT DOCUMENTS

| | | | |
|---|---:|---|---:|
| JP | 200649479 | A | 2/2006 |
| JP | 2006506809 | A | 2/2006 |
| JP | 2007317682 | A | 12/2007 |
| JP | 201073953 | A | 4/2010 |
| JP | 2012134358 | A | 7/2012 |
| KR | 200727159 | A | 3/2007 |
| KR | 200816934 | A | 2/2008 |
| KR | 10948814 | B | 3/2010 |
| WO | 2008004579 | A1 | 1/2008 |
| WO | 2010147485 | A1 | 12/2010 |

* cited by examiner

POLISHING SLURRY AND SUBSTRATE POLISHING METHOD USING THE SAME

CROSS-REFERENCE TO RELATED APPLICATION

This application claims priority to Korean Patent Application No. 10-2013-0165582 filed on Dec. 27, 2013 and all the benefits accruing therefrom under 35 U.S.C. §119, the contents of which are incorporated by reference in their entirety.

BACKGROUND

The present disclosure relates to a polishing slurry, and more particularly, to a polishing slurry used for planarizing tungsten by a chemical mechanical polishing process in a semiconductor manufacturing process, and a substrate polishing method using the same.

Since the surface unevenness of each layer is transferred to a next layer, the degree of waviness of the lowermost layer becomes important, as the size of semiconductor devices gradually decrease, and the number of layers of metal wirings gradually increase. The waviness may seriously influence to such an extent that a photolithography process in a next step may become difficult. Thus, to improve the yield of semiconductor devices, for example, to easily perform a photolithography process in a semiconductor manufacturing process and to decrease the deviation of the resistance of wirings, a planarization process for removing the waviness of an uneven surface generated during performing various processes is necessary. A planarization method includes a reflowing method, an etch back method, a chemical mechanical polishing (CMP) method, etc. after forming a thin film.

A CMP process is a process of evenly polishing by contacting the surface of a semiconductor wafer to a polishing pad, performing a rotational motion and providing a slurry including an abrasive and various compounds. That is, the surface of a substrate or a layer thereon is chemically and mechanically polished by the slurry and the polishing pad and planarized. Generally, the polishing process of a metal is known to be performed by repeating a forming process of a metal oxide (MOx) by an oxidant and a removing process of the metal oxide thus obtained by an abrasive.

The polishing process of tungsten widely used as wirings of a semiconductor device also is performed by a repeating mechanism of a forming process of tungsten oxide ($WO_3$) by an oxidant and a potential modulator and a removing process of the tungsten oxide by an abrasive. Thus, to improve polishing efficiency, the formation of the tungsten oxide by adding the oxidant and the potential modulator, and the removal of the tungsten oxide by the abrasive are necessary to be effectively performed. However, commonly used abrasive, colloidal silica, is not effective because the removal of the tungsten oxide is highly dependent on the concentration of the oxidant. In addition, in the case that the polishing is performed with respect to a substrate including patterns such as a trench, defects such as dishing or erosion are frequently generated. When the dishing or the erosion is generated, the operation properties of a device may be negatively influenced including the malfunction of the device thus manufactured. Therefore, the defects such as dishing or erosion are required to be decreased, and so, the control of chemical factor and mechanical factor are necessary.

The control of the chemical factor may include the control of slurry properties by controlling the concentration of the oxidant and the potential modulator, and the control of the mechanical factor may include the control of the change of commonly used abrasive particles. Meanwhile, Korean Patent Publication No. 10-0948814 discloses a method of polishing by two steps to decrease dishing and erosion. However, in this case, a plurality of slurries is prepared, and a plurality of processes is performed. Thus, the process becomes complicated, and productivity is deteriorated.

SUMMARY

The present disclosure provides a polishing slurry of tungsten and a substrate polishing method using the same.

The present disclosure also provides a polishing slurry of tungsten for decreasing dishing and erosion generated during a polishing process, and a substrate polishing method using the same.

The present disclosure also provides a polishing slurry of tungsten by which polishing selectivity may be controlled by controlling the polishing rates of tungsten and an insulating layer through controlling the zeta potential of abrasive particles, and a substrate polishing method using the same.

The present disclosure also provides a polishing slurry of tungsten that may have high polishing selectivity, low polishing selectivity and reverse polishing selectivity of tungsten and an insulating layer, and a substrate polishing method using the same.

In accordance with an exemplary embodiment, a polishing slurry for tungsten includes an abrasive for performing polishing and having positive zeta potential and a potential modulator for controlling the zeta potential of the abrasive, the potential modulator comprising a compound of three or more components including iron.

The abrasive may include zirconia particles, and the abrasive may be included by greater than approximately 0.2 wt % to less than or equal to approximately 10 wt % based on a total amount of the slurry.

The potential modulator may control the zeta potential of the abrasive by generating anions and may include at least three components including iron.

The potential modulator may include at least one selected from the group consisting of ferric ammonium sulfate, potassium ferrioxalate, ethylenediaminetetraacetic acid ferric sodium, potassium ferricyanide, iron(III) acetylacetonate, ammonium ferric citrate, and ammonium ferric oxalate.

The potential modulator may be included by approximately 0.001-1 wt % based on a total amount of the slurry. The zeta potential of the abrasive may be controlled from approximately +5 mV to approximately −5 mV, and polishing selectivity of the tungsten and an insulating layer may be controlled according to concentration of the potential modulator.

The zeta potential of the abrasive may be approximately 5-3.5 mV, and the polishing selectivity of the tungsten and the insulating layer may be approximately 1:1 to 1:8. In addition, the zeta potential of the abrasive may be approximately −2 mV to approximately 2 mV, and the polishing selectivity of the tungsten and the insulating layer may be greater than or equal to approximately 6:1. Further, the zeta potential of the abrasive may be approximately 2-3.5 mV and less than or equal to approximately −2 mV, and the polishing selectivity of the tungsten and the insulating layer may be approximately 1:1 to 2:1.

A dispersing agent for dispersing the abrasive and for controlling the zeta potential of the abrasive to a smaller quantity than that of the potential modulator may be further included, and the dispersing agent may include an anionic, cationic and nonionic polymer material.

The anionic polymer dispersing agent may include at least one selected from the group consisting of polyacrylic acid, polycarboxylic acid, sodium dodecyl benzenesulfonate, sodium dodecyl sulfate, and sodium polystyrene sulfonate.

The cationic polymer dispersing agent may include at least one selected from the group consisting of polylysine, polyethyleneimine, benzethonium chloride, bronidox, cetrimonium bromide, cetrimonium chloride, dimethyldioctadecylammonium chloride, tetramethylammonium hydroxide, distearyl dimethyl ammonium chloride, polydimethylamine-co-epichlorohydrin, 1,2-dioleoyl-3-trimethylammonium propane, and poly allyl amine.

The nonionic dispersing agent may include at least one selected from the group consisting of polyvinyl pyrrolidone, polyethylene oxide, polyvinyl alcohol, hydroxyethyl cellulose, 2-amino-2-methyl-1-propanol, β-cyclodextrin, fructose, glucose, and galactose.

The dispersing agent may be included by greater than approximately 0.001 to less than or equal to 1 wt % based on a total amount of the slurry.

An oxidant for oxidizing a surface of the tungsten may be further included, and the oxidant may be included by approximately 0.5-5 wt % based on a total amount of the slurry.

The oxidant may include at least one selected from the group consisting of hydrogen peroxide, carbamide peroxide, ammonium persulfate, ammonium thiosulfate, sodium hypochlorite, sodium periodate, sodium persulfate, potassium iodate, potassium perchlorate and potassium persulfate.

A pH control agent for controlling pH of the slurry may be further included, and the pH of the slurry may be less than or equal to 4.

In accordance with another exemplary embodiment, a polishing slurry for tungsten includes an abrasive for performing polishing and having crystallinity, a potential modulator for promoting oxidation of the tungsten, and a dispersing agent for dispersing the abrasive having the zeta potential from approximately 5 mV to approximately −5 mV.

The abrasive may include zirconia particles having an average particle size of first particles of approximately 10-100 nm.

The potential modulator may be included by approximately 0.001-1 wt % based on a total amount of the slurry.

Polishing selectivity of the tungsten and an insulating layer may be approximately 1:8 to 10:1.

In accordance with yet another exemplary embodiment, a substrate polishing method includes preparing a substrate on which a tungsten layer is formed, preparing a polishing slurry including an abrasive for performing polishing and having positive zeta potential, and a potential modulator for controlling the zeta potential of the abrasive; and polishing the tungsten layer while supplying the substrate with the polishing slurry. The zeta potential of the abrasive and polishing selectivity of the tungsten layer and an insulating layer are controlled according to concentration of the potential modulator.

An oxidant may be supplied while supplying the substrate with the slurry.

The polishing may be performed by oxidizing the tungsten layer according to concentration of the potential modulator to form a tungsten oxide layer and polishing the tungsten oxide layer by the abrasive or etching the tungsten layer.

The preparing of the substrate on which a tungsten layer is formed may include forming an insulating layer on the substrate, forming a trench in the insulating layer, and forming a tungsten layer on an entire surface of the insulating layer including the trench.

The polishing of the tungsten layer may include first polishing using a slurry having a polishing rate of the insulating layer greater than a polishing rate of the tungsten layer, and second polishing using a slurry having a polishing rate of the tungsten layer greater than a polishing rate of the insulating layer.

The polishing of the tungsten layer may be performed by using a slurry having polishing selectivity of the tungsten layer and the insulating layer of greater than or equal to approximately 6:1.

The tungsten layer and the insulating layer may be polished at the same time by using a slurry having polishing selectivity of the tungsten layer and the insulating layer of approximately 1:1 to 2:1.

BRIEF DESCRIPTION OF THE DRAWINGS

The patent or application file contains at least one drawing executed in color. Copies of this patent or patent application publication with color drawings will be provided by the Office upon request and payment of the necessary fee.

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

The slurry in accordance with an exemplary embodiment is a tungsten polishing slurry and may include an abrasive for performing polishing, an oxidant for forming an oxide and a potential modulator for promoting the formation of the oxide. The abrasive, the oxidant and the potential modulator may be included in a solution. For example, the abrasive, the oxidant and the potential modulator are dispersed and distributed in water, particularly in distilled (DI) water. In addition, a dispersing agent may be further included to promote the dispersion of the abrasive, and a pH control agent may be further included to control the pH of the slurry. The slurry has a dispersed state of the abrasive in a liquid, and the amount of each component is appropriately adjusted. Meanwhile, the oxidant may not be included in the slurry and may be separately prepared and provided on the substrate during performing the polishing process.

Figure 1A:
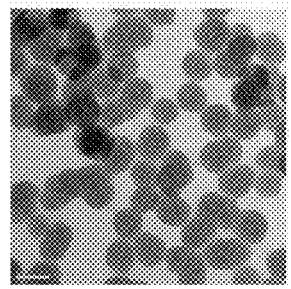
FIGS. 1A, 1B, and 2 illustrate TEM photographic images of colloidal silica used as a common abrasive and a distribution diagram of primary particles.
Figure 1B:
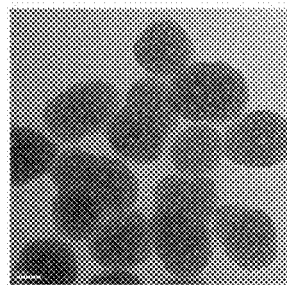
Figure 2:
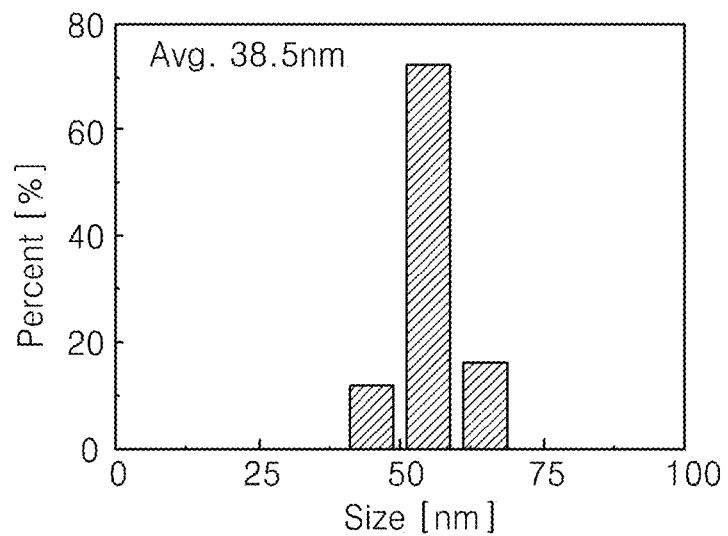
Figure 3A:
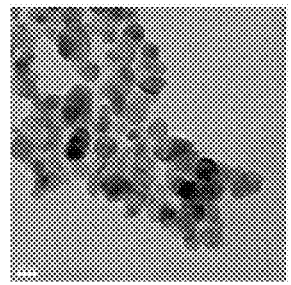
FIGS. 3A, 3B, and 4 illustrate TEM photographic images of zirconia particles used as an abrasive in accordance with an exemplary embodiment and a distribution diagram of primary particles.
Figure 3B:
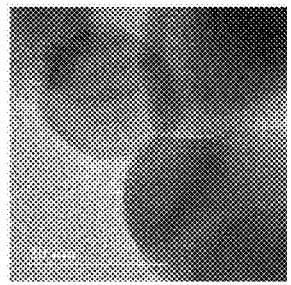
Figure 4:
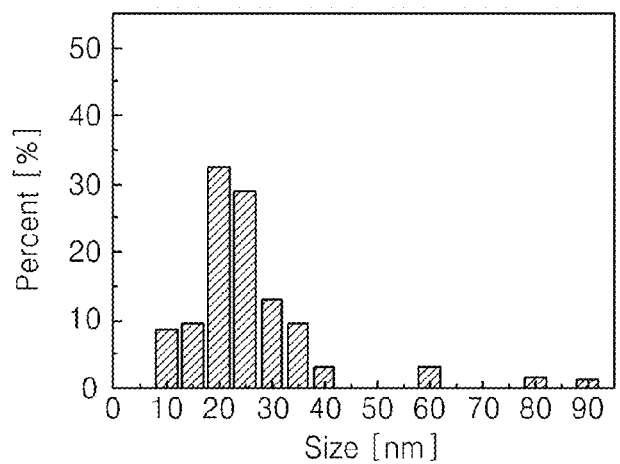
Figure 5:
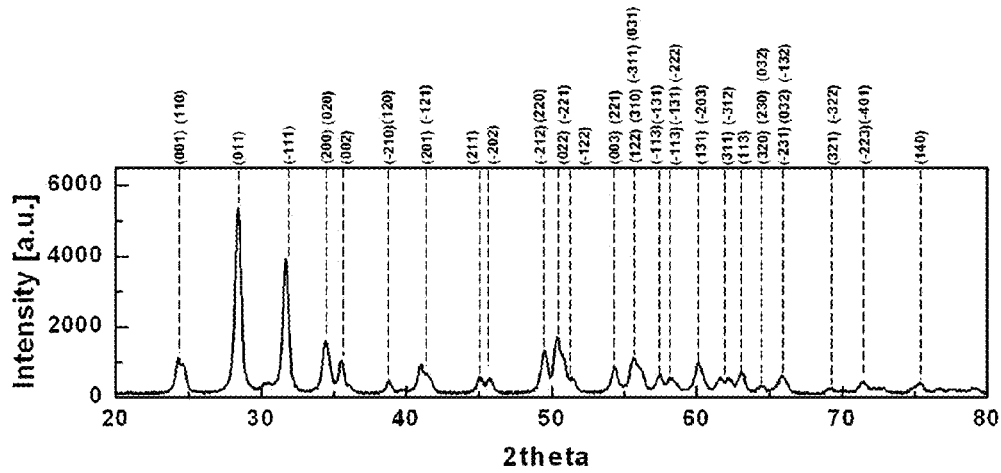
FIG. 5 is an X-ray diffraction graph of zirconia particles.

The abrasive may include abrasive particles having (+) zeta potential. For example, the abrasive particles may include zirconia ($ZrO_2$) particles. The zirconia particles have a crystalline phase and have a polyhedron shape provided with crystal facets. Colloidal silica widely used as a common abrasive has an amorphous phase and a spherical particle shape as shown by transmission electron microscope (TEM) photographic images in FIGS. 1A and 1B. In addition, the primary particles of the colloidal silica are dispersed with the size of approximately 40-70 nm and have an average size of approximately 38.5 nm as shown in FIG. 2. However, the zirconia particles used in an exemplary embodiment has a crystalline phase and a polyhedron shape provided with crystal facets as shown in FIGS. 3A and 3B. In addition, the primary particles of the zirconia particles are dispersed with the size of approximately 10-100 nm and have an average size of approximately 23.3 nm as shown in FIG. 4. The zirconia particles are solid particles and have a crystalline shape of a monoclinic structure when analyzed by X-ray diffraction (XRD) as shown in FIG. 5. Through the provision of the facets, the polishing of tungsten may be efficiently performed. Meanwhile, the primary particles of the zirconia particles in accordance with an exemplary embodiment have an average particle size of approximately 10-100 nm. In the case that the average size of the primary particles is less than approximately 10 nm, polishing rate may be low, and the polishing of tungsten may be difficult, and in the case that the average size of the primary particles is greater than approximately 100 nm, scratches may be generated during polishing. Particularly, the zirconia particles preferably have the average particle size of the primary particles of approximately 15-50 nm. Within the above-described range, the concentration of the abrasive particles may be optimized, and high polishing rate may be obtained while minimizing the generation of scratches. In addition, the amount of the zirconia particles may be approximately greater than approximately 0.2 to less than or equal to approximately 10 wt % based on the total amount of the slurry. In the case that the amount of the zirconia particles is less than or equal to approximately 0.2 wt %, the polishing rate is excessively small, and polishing may be difficult, and in the case that the amount exceeds approximately 10 wt %, the dispersion stability of particle may be unfavorable, and the size of secondary particles may be excessively increased to generate scratches. Particularly, the amount of the zirconia particles may be approximately 0.3-5 wt %, and more preferably be approximately 0.4-2 wt %. In the case that the amount of the zirconia particles is approximately 0.4-5 wt %, the polishing rate of tungsten may be good, and the dispersion stability may be secured, and in the case that the amount of the zirconia particles is approximately 0.4-2 wt %, the polishing rate of tungsten may be even better.

The dispersing agent plays the role of uniformly dispersing the abrasive in the slurry and may use a cationic, an anionic, and a nonionic polymer material. In addition, the dispersing agent may minutely control the zeta potential of the abrasive. That is, the cationic dispersing agent may increase the zeta potential of the abrasive to positive potential, and the anionic dispersing agent may decrease the zeta potential of the abrasive to negative potential. In addition, the nonionic dispersing agent may maintain the zeta potential of the abrasive as it is. Accordingly, the zeta potential of the abrasive may be maintained or minutely controlled to the positive potential or the negative potential according to the dispersing agent included in the slurry. The cationic polymer dispersing agent may include at least one selected from the group consisting of polylysine, polyethyleneimine, benzethonium chloride, bronidox, cetrimonium bromide, cetrimonium chloride, dimethyldioctadecylammonium chloride, tetramethylammonium hydroxide, distearyl dimethyl ammonium chloride, polydimethylamine-co-epichlorohydrin, 1,2-dioleoyl-3-trimethylammonium propane, and poly allyl amine. The anionic polymer dispersing agent may include at least one selected from the group consisting of polyacrylic acid, polycarboxylic acid, sodium dodecyl benzenesulfonate, sodium dodecyl sulfate, and sodium polystyrene sulfonate. In addition, the nonionic dispersing agent may include at least one selected from the group consisting of polyvinyl pyrrolidone, polyethylene oxide, polyvinyl alcohol, hydroxyethyl cellulose, 2-amino-2-methyl-1-propanol, β-cyclodextrin, fructose, glucose, and galactose. The concentration of the dispersing agent may be approximately greater than 0.01 wt % to less than or equal to approximately 1 wt % based on the total amount of the slurry. In the case that the amount is less than or equal to approximately 0.01 wt %, the dispersion may not be performed well, and precipitations may be produced. In the case that the amount exceeds 1 wt %, ionization concentration may be increased, and precipitations may be produced. Particularly, the dispersing agent may preferably be included by approximately 0.05-0.5 wt % based on the total amount of the slurry, and may more preferably be included by approximately 0.06-0.3 wt %. Within the amount range, dispersion stability is good, and the control of the zeta potential of the abrasive may be favorable.

The oxidant oxidizes an object to be polished, that is, the surface of a tungsten layer. The oxidant may include at least one selected from the group consisting of hydrogen peroxide ($H_2O_2$), carbamide peroxide, ammonium persulfate, ammonium thiosulfate, sodium hypochlorite, sodium periodate, sodium persulfate, potassium iodate, potassium perchlorate and potassium persulfate. The hydrogen peroxide is usually used in an exemplary embodiment. The amount of the oxidant may be approximately 0.5-5 wt % based on the total amount of the slurry. In the case that the amount of the oxidant is less than or equal to approximately 0.5 wt %, an oxide may not be formed on the tungsten layer well, polishing rate may be low, and polishing may be difficult. In the case that the amount exceeds approximately 5 wt %, the reaction with a potential modulator and an abrasive may be seriously carried out, and the stability of the slurry may be deteriorated. Particularly, in the case that the amount of the oxidant is approximately 1-5 wt %, the high polishing rate and the stability of the slurry may be secured. Meanwhile, the oxidant may be included in the slurry, or may be separately prepared and provided on the substrate during polishing processing separately from the slurry. In the case that the oxidant is provided separately from the slurry, the amount of the oxidant may be approximately 0.5-5 wt % based on the total amount of the slurry.

The potential modulator promotes the oxidation of the surface of the tungsten and controls the zeta potential of the abrasive. Without the potential modulator, the polishing of the tungsten may be performed, however the polishing rate thereof may be low. Through using the potential modulator, the oxidation of the surface of the tungsten may be promoted, and the polishing rate thereof may be increased. In addition, the potential modulator may induce anions and control the zeta potential of the abrasive having positive potential. That is, the potential modulator may control the zeta potential of the abrasive having strong positive potential so as to have weak positive potential or negative potential. Thus, the potential modulator may control the zeta potential of the abrasive significantly. As the potential modulator in accordance with exemplary embodiments, a compound containing iron and include three or more components may be used. For example, an iron oxide-based material including three or more components may be used as the potential modulator. When an iron oxide including two components is used, the iron oxide may react directly with the oxidant and may induce the temperature increase or the color change of the slurry. However, when an iron oxide including three or more components is used, the zeta potential of the abrasive may be easily changed to a negative value. That is, a potential modulator including three or more components may control the zeta potential of the abrasive from a positive value to a negative value according to the amount thereof. The potential modulator may include at least one selected from the group consisting of ferric ammonium sulfate ($NH_4Fe(SO_4)_2 \cdot 12H_2O$), potassium ferrioxalate ($K_3Fe(C_2O_3)_3$), ethylenediaminetetraacetic acid ferric sodium (NaFeEDTA or $NaFeC_{10}H_{12}N_2O_8$), potassium ferricyanide ($K_3[Fe(CN)_6]$), iron(III) acetylacetonate ($Fe(C_5H_7O_2)_3$), ammonium ferric citrate ($C_6H_8O_7 \cdot nFe \cdot nH_3N$), and ammonium ferric oxalate ($(NH_4)_3[Fe(C_2O_4)_3]$). As described above, the ferric ammonium sulfate is composed of ions of three components, $NH_4$, Fe and $SO_4$, and the potassium ferrioxalate is composed of ions of three components, K, Fe and ($C_2O_3$). That is, the potential modulator in accordance with an exemplary embodiment may include a compound composed of ions of three or more components. In an exemplary embodiment, the potassium ferrioxalate ($K_3Fe(C_2O_3)_3$) may be usually used, and the amount of the potential modulator may be approximately 0.001-1 wt % based on the total amount of the slurry. In the case that the amount of the potassium ferrioxalate is less than approximately 0.001 wt %, the polishing rate is too small, and the polishing may be difficult. In addition, the zeta potential of the abrasive may be greater than or equal to +5 mV, and too much amount of the polishing abrasive may be adsorbed to the surface of tungsten. In the case that the amount of the potassium ferrioxalate exceeds approximately 1 wt %, the slurry may be discolored, and the zeta potential of the abrasive may decrease to less than or equal to approximately −5 mV, and the surface of the tungsten may be heavily etched. Preferably, the amount of the potassium ferrioxalate is approximately 0.001-0.5 wt % based on the total amount of the slurry. When a slurry for a buried gate used for the formation of a gate having less than or equal to approximately 30 nm in a DRAM is used, first and second polishing processes are necessary. However, when approximately 0.04-0.05 wt % the potassium ferrioxalate having the polishing selectivity of tungsten and an oxide layer of greater than or equal to 6, for example, approximately 6-10, is used, polishing process may be performed once until the oxide layer is exposed. In this case, appropriate zeta potential is from approximately −2 mV to approximately 2 mV. In addition, when a slurry for tungsten used for the formation of a tungsten metal wiring or a plug having approximately 30-150 nm in a DRAM, a NAND flash memory or a novel memory, first and second polishing processes are necessary. However, in an exemplary embodiment, when greater than or equal to approximately 0.01 wt % to less than approximately 0.04 wt % or greater than approximately 0.05 wt % to less than or equal to approximately 0.5 wt % of the potassium ferrioxalate having the polishing selectivity of tungsten and an oxide layer of approximately 6-10 is used, polishing process may be performed once until the oxide layer is exposed. In this case, the zeta potential of the abrasive may preferably be approximately 2-3.5 mV or less than or equal to approximately −2 mV. In addition, when the first and second polishing processes are performed as in a common process, the erosion phenomenon generated by the polishing of the oxide layer during the second process may be decreased when a little dishing is rather generated in the tungsten after polishing by the first process. In this case, the amount of the potassium ferrioxalate having higher polishing selectivity with respect to an oxide layer when compared to tungsten may preferably be approximately 0.001-0.01 wt %, and the zeta potential thereof may preferably be approximately 3.5-4.5 mV.

Figure 6:
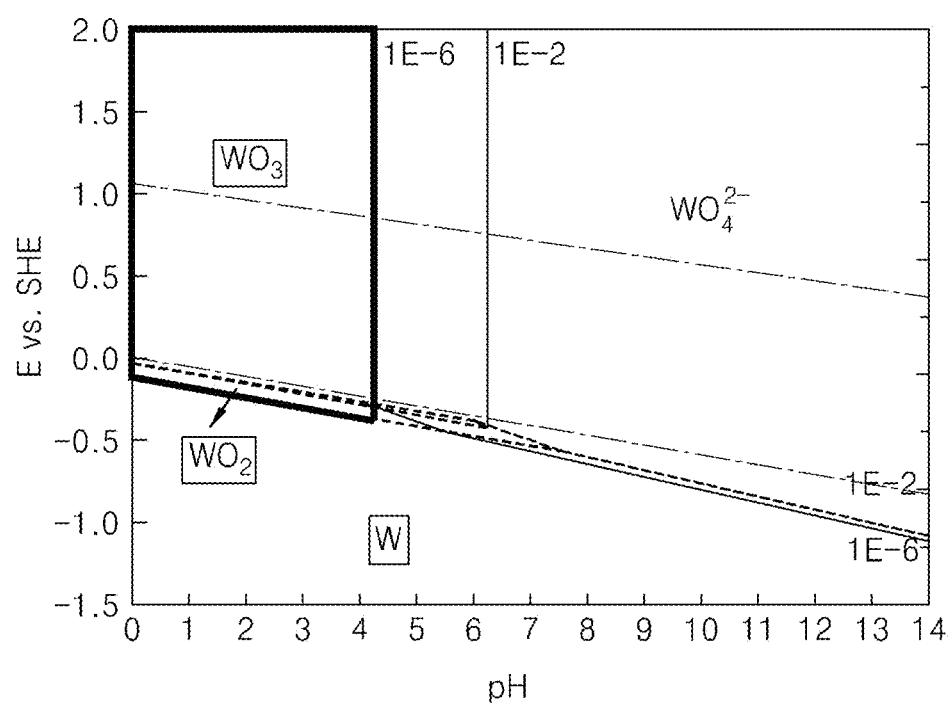
FIG. 6 is a pourbaix diagram of tungsten.

In addition, the slurry in accordance with an exemplary embodiment may further include a pH control agent. The pH control agent may include nitric acid and may control the pH of the slurry. In an exemplary embodiment, the pH of a slurry may be controlled to less than or equal to approximately 4 by using the pH control agent, and the pH may preferably be controlled to approximately 2-4, and more preferably be controlled to approximately 2-2.5. The reason why the pH of the slurry is controlled may be known from FIG. 6 illustrating a pourbaix diagram of tungsten. As shown in FIG. 6, when the potential is positive (+), and the pH of the slurry is greater than or equal to 4, the surface of tungsten may be ionized and form $WO_4^{-2}$. Thus, when polishing is performed in these conditions, the surface of the tungsten may be corroded. However, when the potential is positive (+), and the pH of the slurry is less than or equal to 4, softer tungsten oxide ($WO_3$) than the surface of tungsten may be formed. In this case, the polishing rate may increase. Thus, tungsten may be polished or etched after controlling the pH of the slurry to less than or equal to 4 and controlling the potential in accordance with an exemplary embodiment.

The slurry for polishing tungsten in accordance with an exemplary embodiment follows the mechanism of the following Chemical Reaction 1. First, the surface of tungsten may be ionized by the reaction with trivalent ferric ions ($Fe^{3+}$), and the trivalent ferric ions may be reduced to divalent ferrous ions ($Fe^{2+}$). The divalent ferrous ions ($Fe^{2+}$) may be oxidized by the reaction with hydrogen peroxide ($H_2O_2$) to the trivalent ferric ions ($Fe^{3+}$) and form oxygen ($O_2$). The oxygen thus formed may react with the surface of the tungsten to from soft tungsten oxide ($WO_2$), and the tungsten oxide ($WO_2$) may react with the oxygen again to form tungsten oxide ($WO_3$). The tungsten oxide ($WO_3$) thus formed may be removed by abrasive particles, and the polishing may be performed by the above-described circular mechanism.

$$W + 6Fe^{3+} + 3H_2O \rightarrow WO_3 + 6Fe^{2+} + 6H^+$$

$$Fe^{3+} + W \rightarrow Fe^{2+} + W^+$$

$$Fe^{2+} + H_2O_2 \rightarrow Fe^{3+} + H_2O + O_2 \uparrow$$

$$W + O_2 \rightarrow WO_2$$

$$WO_2 + O_2 \rightarrow WO_3 + H_2O \quad \text{[Chemical Reaction 1]}$$

Meanwhile, the polishing rate of a metal, the polishing selectivity of a metal and an insulating layer, and a surface without corrosion after polishing are the most important factors in performing the polishing process of a metal. Major considerations during preparing a slurry may include the dispersion stability of the slurry, that is, the secondary particle size, the zeta potential of an abrasive, and the zeta potential of a material to be polished. In the case that the zeta potential of the material to be polished and the zeta potential of the abrasive are not appropriately controlled, the polishing rate may be lowered, and corrosion may be generated at the surface of after polishing. In addition, a large amount of abrasive particles may be adsorbed on the surface after polishing, and defects concerning washing, etc. may be generated. In an exemplary embodiment, a slurry having the zeta potential of the abrasive of approximately −5 mV to approximately 5 mV was prepared so as to provide the slurry with good dispersion stability, and polishing performance according to the zeta potential of the abrasive was compared.

EMBODIMENTS

The preparation process of the slurry in accordance with an exemplary embodiment is not much different from a preparation process of a common slurry, and so, the process will be explained in brief. First, a vessel for preparing a slurry was prepared, and distilled water (DI water) and a dispersing agent of an appropriate amount were added in the vessel and sufficiently mixed. Then, a certain amount of zirconia particles having a crystalline structure and having the average particle size of primary particles were measured and added in the vessel, followed by mixing uniformly. In addition, a certain amount of potassium ferrioxalate as a potential modulator was added in the vessel and mixed uniformly. A pH control agent such as nitric acid was added in the vessel and mixed to obtain a slurry. Hydrogen peroxide was mixed uniformly in the slurry immediately before polishing, and polishing was performed. In an exemplary embodiment, the addition amounts of the zirconia particles and the dispersing agents were approximately 1.2 wt % and approximately 0.2 wt %, respectively, based on the total amount of the slurry. The amount of the potential modulator was diversely changed from approximately 0.001 wt % to approximately 1 wt % based on the total amount of the slurry. That is, a plurality of slurries was prepared according to the amount added of the potential modulator. The pH of each of the slurries was control to approximately 2.3 by using nitric acid.

Figure 7:
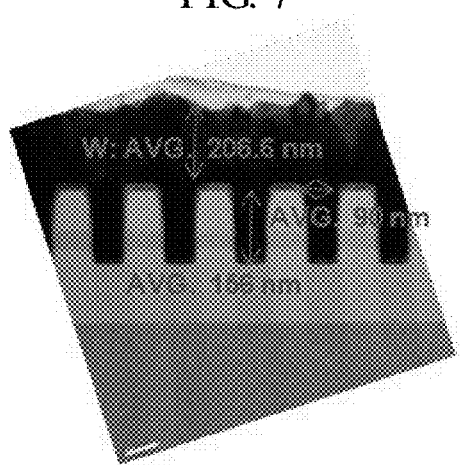
FIG. 7 is a TEM photographic image of a pattern wafer used in an exemplary embodiment.

In addition, a plurality of wafers for performing polishing using the slurries in accordance with exemplary embodiments was prepared. An oxide layer and titanium nitride were deposited to approximately 1,000 Å, respectively, on a silicon wafer, and tungsten was deposited to approximately 6,000 Å to prepare a tungsten wafer. In addition, an oxide layer wafer including an insulating layer formed by depositing PETEOS to approximately 7,000 Å was prepared. As shown in FIG. 7, a pattern wafer having an average pattern width of approximately 90 nm and a pattern depth of approximately 120-150 nm and including titanium nitride deposited to approximately 200 Å on the PETEOS and tungsten deposited to approximately 2,000 Å was prepared. A poli-300 apparatus of G & P Tech Co., was used as a polishing apparatus, and IC 1000/Suba IV CMP pad of Rohm & Haas Co., was used as a polishing pad. As polishing conditions, a down pressure was approximately 6 psi, the rates of head and spindle were approximately 70 rpm, respectively, and the flowing rate of the slurry was approximately 100 ml/min. The tungsten layer and the oxide layer were polished for approximately 60 seconds, respectively.

In the following Table 1, the hardness of the zirconia particles, the oxide layer and the tungsten oxide are compared and illustrated. The hardness of the oxide layer is approximately 6-7, the hardness of the surface of the tungsten is approximately 5-6, and the hardness of the zirconia particles is approximately 8. Since the hardness of the zirconia particles is greater than those of the oxide layer and the tungsten, the zirconia particles may be appropriately used as the polishing particles of the oxide layer and the tungsten.

TABLE 1

|  | Zirconia | Oxide layer | Tungsten (tungsten oxide) |
| --- | --- | --- | --- |
| Hardness | 8 | 6-7 | 5-6 |

Figure 8A:
FIGS. 8A and 8B are photographic images for securing the dispersion stability of slurries with respect to the concentration of a potential modulator used in exemplary embodiments.
Figure 8B:
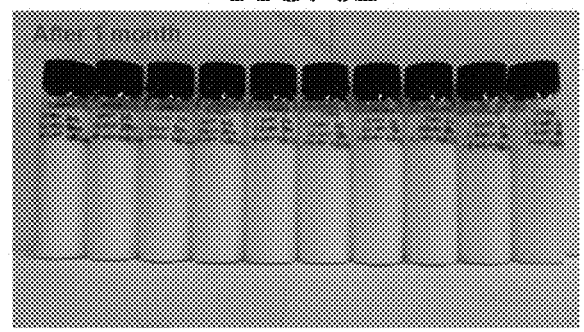
Figure 12:
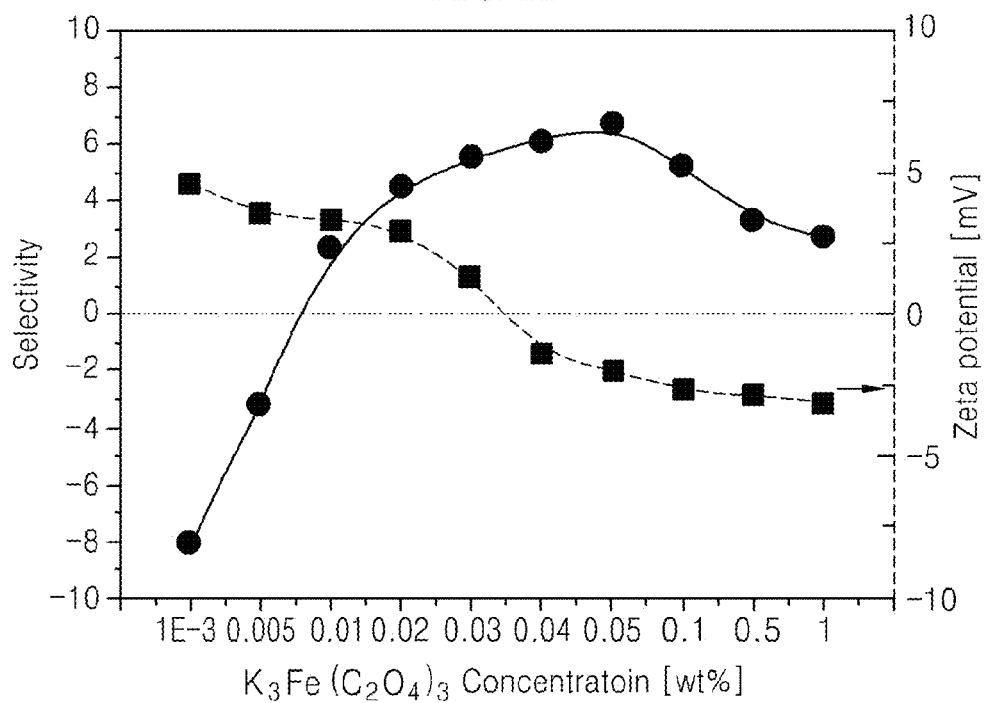
FIG. 12 is a graph illustrating the polishing selectivity and zeta potential of tungsten and an oxide layer with respect to the concentration of a potential modulator.

FIGS. 8A and 8B are photographic images for confirming the dispersion stability of a slurry with respect to the concentration of the potassium ferrioxalate. In accordance with an exemplary embodiment, after dispersing the zirconia particles at the pH of approximately 2.3 using an anionic dispersing agent, a plurality of slurries was prepared with different concentration of the potassium ferrioxalate from approximately 0.001 to approximately 1 wt % in a vessel of 50 ml, and the slurries were left for about one month. FIG. 8A is a photographic image showing the slurries after the preparation thereof, and FIG. 8B is a photographic image showing the slurries after left for one month. When defects of the dispersion stability of the slurry outbreak, precipitations are formed in the slurry. For the slurries in accordance with exemplary embodiments, no precipitations were formed after left for one month as shown in FIG. 8B, and the dispersion stability of the slurries is good.

potassium ferrioxalate are shown in FIG. 12. In this case, the polishing rate of the tungsten and the oxide layer were calculated by polishing a tungsten wafer and an oxide layer wafer, respectively, and the polishing selectivity is the ratio of the polishing rate of the tungsten and the polishing rate of the oxide layer.

TABLE 2

| | Dispersing agent | | | Polishing rate [Å/min] | | Polishing selectivity | Zeta potential [mV] | Secondary particle size [nm] |
|---|---|---|---|---|---|---|---|---|
| $ZrO_2$ | | $K_3Fe(C_2O_4)_3$ | pH | W | Oxide | | | |
| 1.2 | 0.2 | 0.001 | 2.3 | 55 | 448 | −8.1 | 4.55 | 170 |
| | | 0.005 | | 142 | 451 | −3.2 | 3.54 | 173.4 |
| | | 0.01 | | 719 | 319 | 2.3 | 3.3 | 196.8 |
| | | 0.02 | | 987 | 223 | 4.4 | 2.92 | 193.2 |
| | | 0.03 | | 980 | 179 | 5.5 | 1.32 | 181.5 |
| | | 0.04 | | 930 | 152 | 6.1 | −1.44 | 185.3 |
| | | 0.05 | | 897 | 133 | 6.7 | −2 | 179.7 |
| | | 0.1 | | 544 | 104 | 5.2 | −2.69 | 174.6 |
| | | 0.5 | | 297 | 91 | 3.3 | −2.88 | 170.4 |
| | | 1 | | 269 | 98 | 2.7 | −3.09 | 176.1 |

Figure 9:
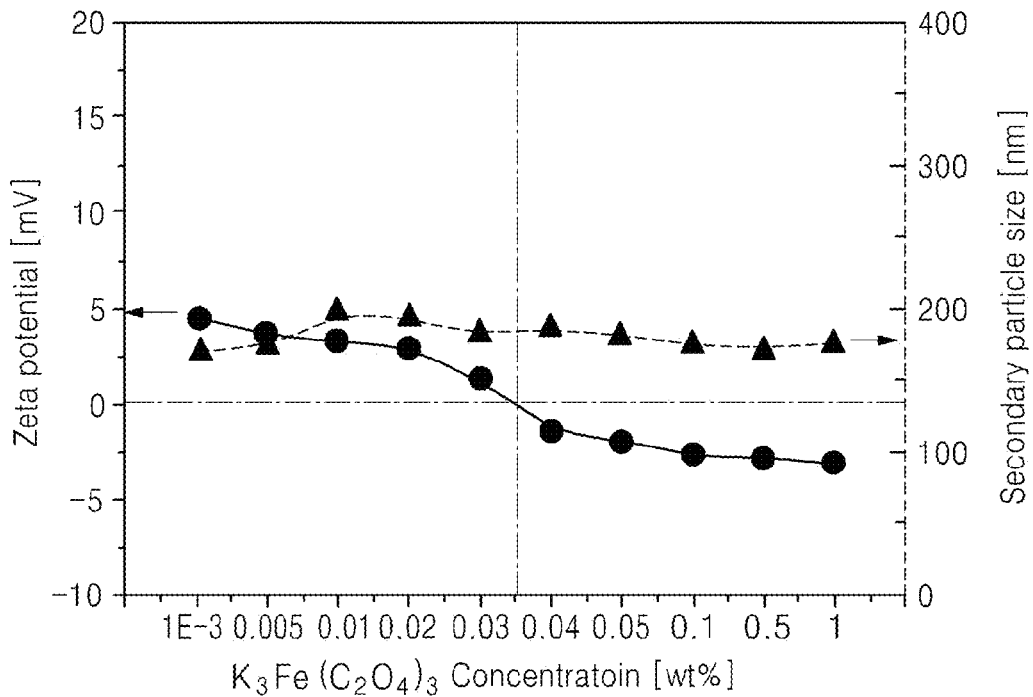
FIG. 9 is a graph illustrating the secondary particle size and zeta potential of a slurry with respect to the concentration of a potential modulator.

FIG. 9 is a graph illustrating the secondary particle size and zeta potential of a slurry with respect to the concentration of potassium ferrioxalate. As shown in FIG. 9, the secondary particle size was maintained to approximately 150-200 nm and agglomeration was not generated, and zeta potential was changed to (−) potential from approximately +4.5 to approximately −3.1 mV after preparing the slurries according to the increase of the concentration of the potassium ferrioxalate. When measuring the secondary particle size and the zeta potential after left for one month, no significant difference was found from the values measured immediately after the preparation. In addition, the zeta potential was positive (+) until the concentration of the potassium ferrioxalate was up to approximately 0.03 wt %, and was negative (−) when the concentration was greater than or equal to approximately 0.04 wt %. That is, the zeta potential changed from the positive value to the negative value according to the increase of the concentration of the potassium ferrioxalate. Since the potassium ferrioxalate is ionized in an aqueous solution into $K^{3+}$ and $[Fe(C_2O_4)_3]^{3−}$, the $[Fe(C_2O_4)_3]^{3−}$ ions are adsorbed on the surface of the zirconia particles having positive zeta potential as the concentration of a potential modulator increases. Thus, the zeta potential at the surface of the zirconia particles is considered to be finally changed to a negative value.

Figure 10:
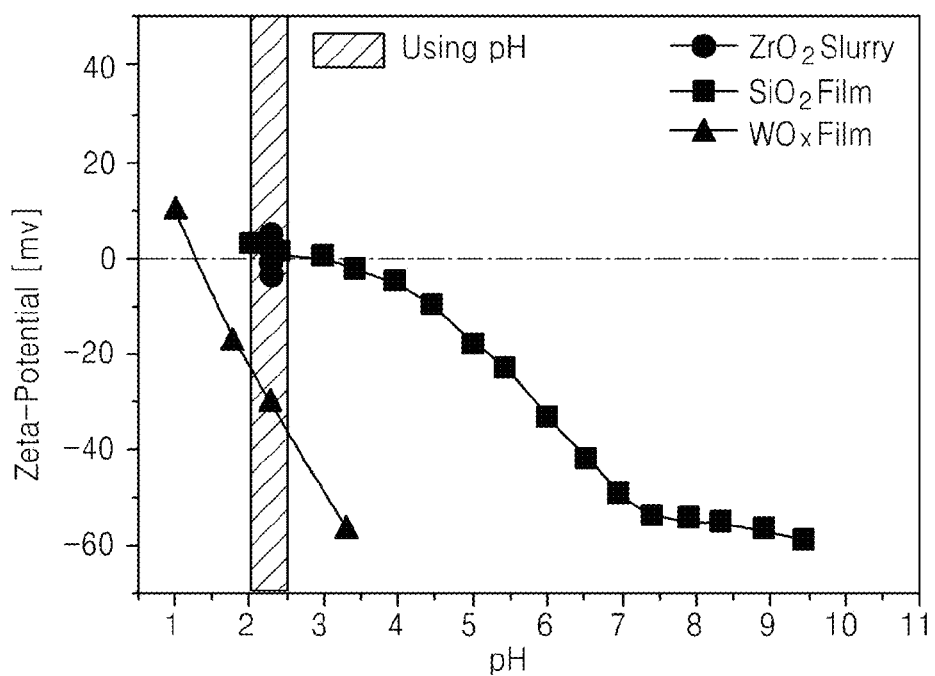
FIG. 10 is a graph illustrating the zeta potential of tungsten and an oxide layer.

In addition, the zeta potential of tungsten oxide and an oxide layer to be polished is illustrated in FIG. 10. As shown in FIG. 10, the zeta potential of the tungsten oxide is rapidly decreased according to the increase of pH, and an isoelectric point (IEP) is shown at the pH of approximately 1.5, and the zeta potential is approximately −30 mV at the pH of approximately 2-3. In addition, the zeta potential of the oxide layer has an IEP at the pH of approximately 3, and has a slightly positive value at the pH of approximately 2-3.

Figure 11:
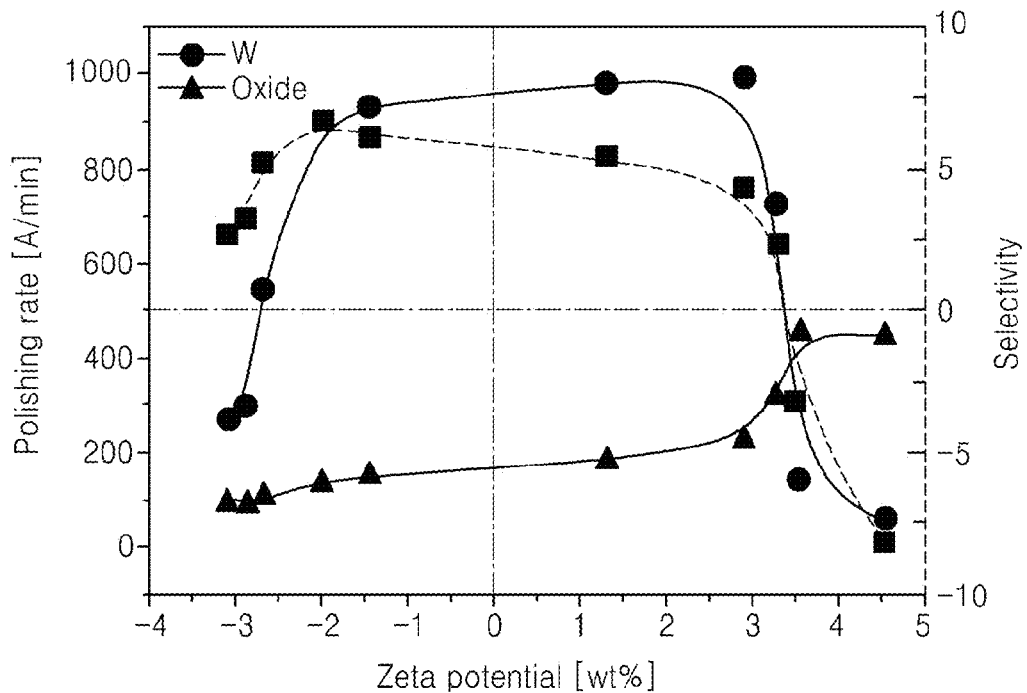
FIG. 11 is a graph illustrating the polishing rate and selectivity of tungsten and an oxide layer with respect to zeta potential.

Table 2 shows the polishing rate of the tungsten and the oxide layer; the zeta potential and the secondary particle size of the slurry according to the concentration of potassium ferrioxalate in numerical values. These values are schematized by the polishing rate and the selectivity of the tungsten and the oxide layer according to the zeta potential of the slurry and illustrated in FIG. 11. In addition, the polishing selectivity of the tungsten and the oxide layer and the zeta potential of the slurry according to the concentration of the The polishing rate of the tungsten is largely dependent on the generating degree of soft tungsten oxide. When the potassium ferrioxalate is included by a low concentration of approximately 0.001 or approximately 0.005 wt %, oxidation promoting reaction is performed less, and the generation degree of the tungsten oxide is decreased, thereby having low polishing rate. In addition, when the concentration of the potassium ferrioxalate is approximately 0.01 to 0.04 wt %, an appropriate catalyst reaction may occur, and a thick tungsten oxide may be formed, thereby having high polishing rate. However, when the potassium ferrioxalate is included by a high concentration of approximately 0.05-1.0 wt %, the polishing rate tends to decrease because the zeta potential has a negative value. When inspecting the pourbaix diagram of the tungsten, tungsten oxide is produced in the potential region from the positive zeta potential to the weak negative zeta potential at the pH region of approximately 2.3. The zeta potential of the tungsten oxide without adding a chemical at the pH region of approximately 2-3 is the degree of approximately −30 mV. When a slurry including a high concentration of a potential modulator is supplied thereto, the tungsten oxide may have greater negative zeta potential still more. Thus, the tungsten oxide may not be formed on the surface of the tungsten, and etching may be generated at the surface of the tungsten with the decrease of the polishing rate.

In addition, the polishing rate of the oxide layer shows similar tendency as the zeta potential of the abrasive particles. As the zeta potential of the abrasive particles decrease from positive to negative, the polishing rate also decreases. The oxide layer has weak positive zeta potential at the pH of approximately 2.3. When the slurry has positive zeta potential, the oxide layer also has the positive zeta potential, and the polishing may be performed well. Since in the coulomb force shown in the following Equation 1, both $Q_1$ (surface charge of the oxide layer) and $Q_2$ (surface charge of the abrasive particles) are positive, repulsive force has a positive value, and the polishing may be performed well. As the potential modulator of the high concentration is added, the zeta potential of the abrasive particles may have greater negative value still more. In this case, $Q_1$ and $Q_2$ have a positive value and a negative value, and the coulomb force (F) has a negative adsorption force, thereby decreasing the polishing rate.

$$F = \frac{Q_1 \times Q_2}{4\pi\varepsilon y^2} \qquad \text{[Equation 1]}$$

where, F is coulomb force, v is a distance between the abrasive particles and a material to be polished, and $\in$ is a dielectric constant.

Figure 13A:
FIGS. 13A to 13D are schematic diagrams illustrating the polishing mechanism of tungsten.
Figure 13B:
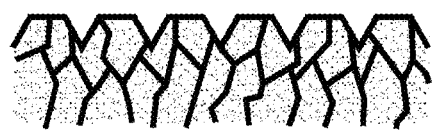
Figure 13C:
Figure 13D:
Figure 14A:
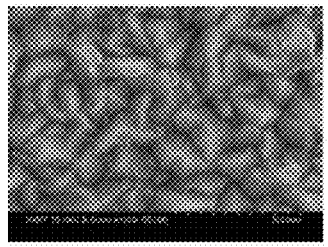
FIGS. 14A to 14K are SEM photographic images of the surface of tungsten after polishing with respect to the concentration of a potential modulator.
Figure 14B:
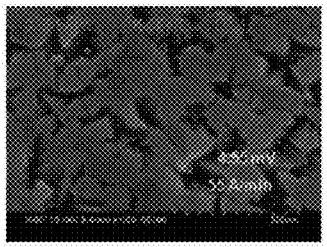
Figure 14C:
Figure 14D:
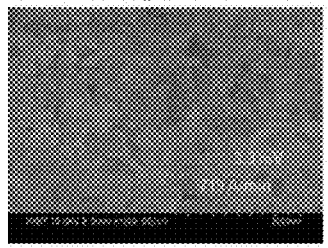
Figure 14E:
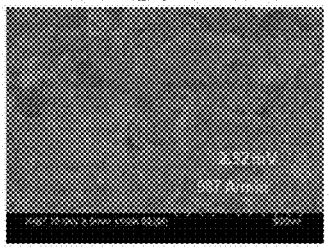
Figure 14F:
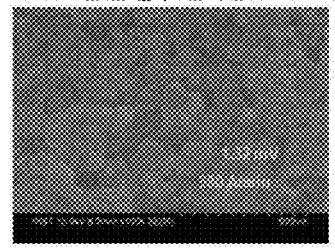
Figure 14G:
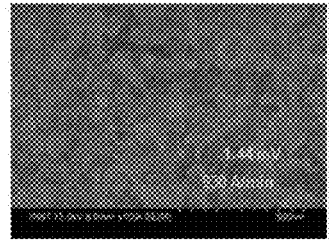
Figure 14H:
Figure 14I:
Figure 14J:
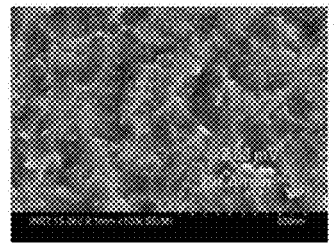
Figure 14K:
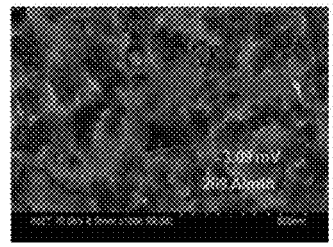
Figure 15A:
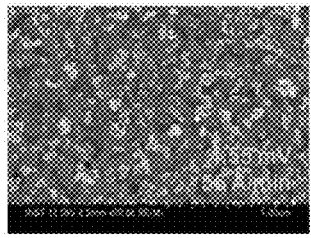
FIGS. 15A to 15J and 16A to 16D are SEM photographic images of the surface of tungsten and an oxide layer excluding a buffing process after polishing with respect to the concentration of a potential modulator.
Figure 15B:
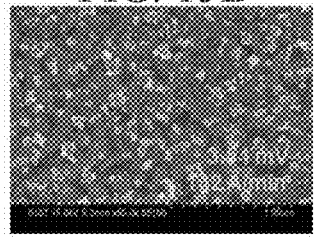
Figure 15C:
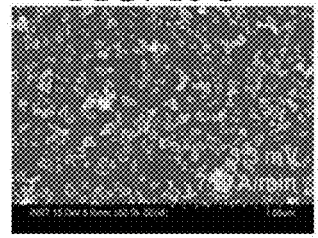
Figure 15D:
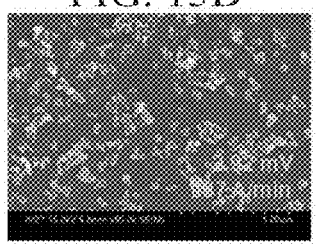
Figure 15E:
Figure 15F:
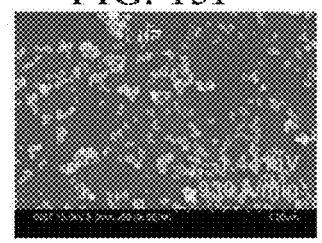
Figure 15G:
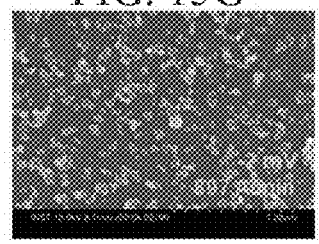
Figure 15H:
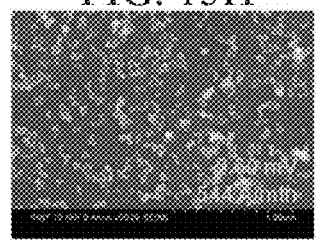
Figure 15I:
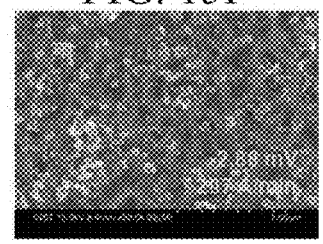
Figure 15J:
Figure 16A:
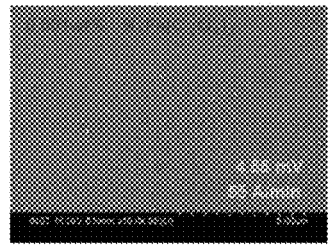
Figure 16B:
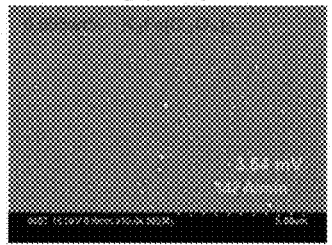
Figure 16C:
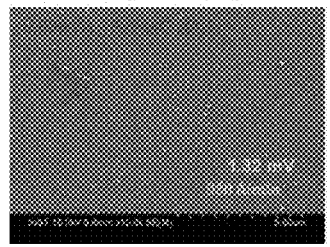
Figure 16D:
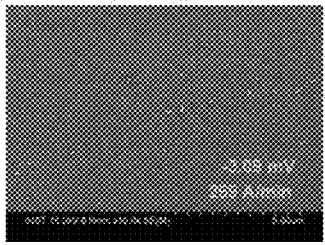

FIGS. 13A to 13D illustrate schematic diagrams illustrating polishing mechanism of tungsten, and FIGS. 14A to 14K are scanning electron microscope (SEM) photographic images of the surface of tungsten after polishing. As shown in FIGS. 13A and 14A, the grains of the tungsten before polishing are large, and have uneven surfaces. When the polishing is performed using a slurry including approximately 0.001 wt % or approximately 0.005 wt % of the potassium ferrioxalate, the polishing rate is low, and the polishing is not performed further from the uneven grains. Thus, dent shapes as shown in FIGS. 13B, 14B, and 14C may remain. However, when the polishing is performed using a slurry including approximately 0.01-0.04 wt % of the potassium ferrioxalate and having an appropriate polishing rate, the uneven shapes are disappeared and grains having even surfaces as shown in FIGS. 13C, 14D to 14G may be obtained. When the polishing is performed using a slurry including greater than or equal to approximately 0.05 wt % of the potassium ferrioxalate, the even surfaces may be disappeared, and the surface of the tungsten may be etched further according to the increase of the concentration as shown in FIGS. 13D, and 14H to 14K. When comparing the zeta potential of the abrasive particle and the polishing rate, the polishing rate is decreased as the zeta potential recedes from near IEP. With the slurry including the abrasive particles having negative zeta potential, the surface of the tungsten may be confirmed to be etched.

Figure 17:
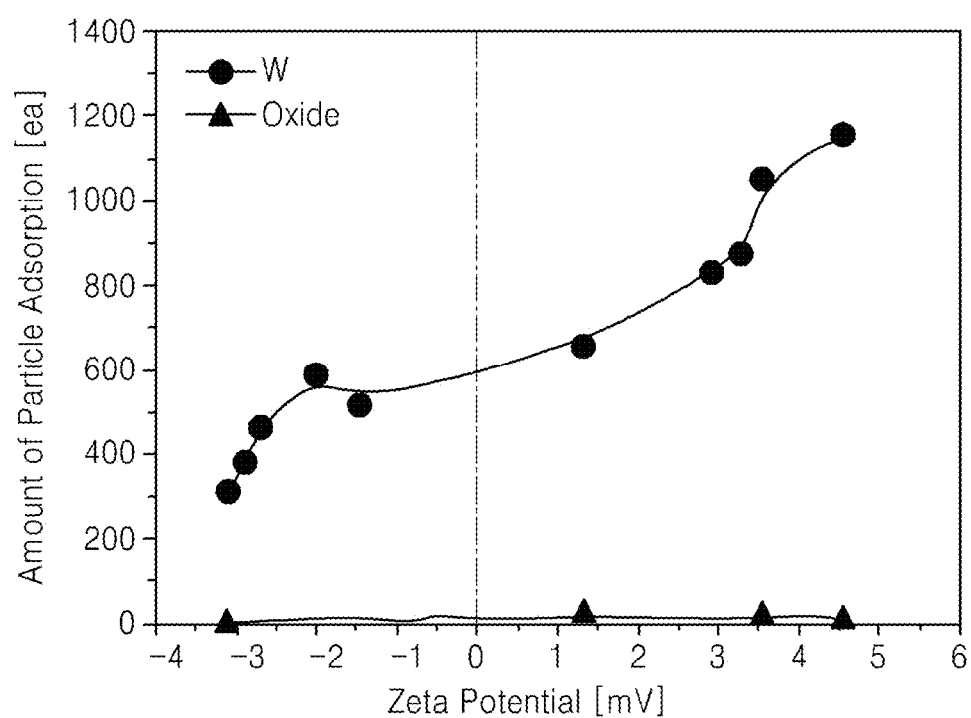
FIG. 17 is a graph illustrating the number of polishing particles at the surface of tungsten and an oxide layer excluding a buffing process after polishing with respect to the concentration of a potential modulator.

FIGS. 15A to 15J are SEM photographic images of the surface of tungsten excluding a buffing process by which a polishing apparatus is rotated while spraying distilled water for 10 seconds after polishing with respect to the concentration of potassium ferrioxalate. In this case, the number of the abrasive particles were counted and are illustrated in FIG. 17 for examining the adsorption degree of the abrasive particles to the surface of the tungsten according to the zeta potential. FIGS. 15A to 15J correspond to the photographic images after polishing the tungsten using slurries including approximately 0.001 wt %, 0.005 wt %, 0.01 wt %, 0.02 wt %, 0.03 wt %, 0.04 wt %, 0.05 wt %, 0.1 wt %, 0.5 wt % and 1 wt % of the potassium ferrioxalate, respectively. As shown in FIGS. 15A to 15J, the adsorption amount of the abrasive particles decrease as the concentration of the potassium ferrioxalate increases. The potassium ferrioxalate in an aqueous solution is decomposed to $K^{3+}$ and $[Fe(C_2O_4)_3]^{3-}$, and $[Fe(C_2O_4)_3]^{3-}$ is present at the surface of the zirconia particles. Thus, as the concentration of the potassium ferrioxalate increases, the zeta potential of the abrasive particles changes to negative values. In addition, since the zeta potential of the tungsten oxide is a strongly negative value of approximately −30 mV at the pH of approximately 2.3, the number of the particles adsorbed is considered to decrease as the zeta potential of the abrasive particles changes to the negative values.

FIGS. 16A to 16D are SEM photographic images of the surface of an oxide layer excluding a buffing process after polishing with respect to the concentration of potassium ferrioxalate. In addition, the number of the abrasive particles were counted and are illustrated in FIG. 17. FIGS. 16A to 16D correspond to the photographic images after polishing the oxide layer using slurries including approximately 0.001 wt %, 0.005 wt %, 0.03 wt %, and 1 wt % of the potassium ferrioxalate, respectively. With the increase of the concentration of the potassium ferrioxalate, the adsorption amount of the abrasive particles has not much difference. Since the zeta potential of the surface of the oxide layer has a value near the IEP, the adsorption is not conducted irrespective of the value of the zeta potential of the slurry.

Table 3 illustrates the properties of a pattern used in a metal wiring or a plug formed by polishing using a slurry including approximately 0.001 wt %, 0.01 wt %, 0.05 wt % and 0.1 wt % of potassium ferrioxalate in a DRAM, a NAND flash memory or a novel memory manufacturing process. FIGS. 18A to 18D are TEM photographic images after polishing tungsten. The pattern wafer illustrated in FIG. 7 was polished using a slurry having a different concentration of potassium ferrioxalate.

TABLE 3

| | $K_3Fe(C_2O_4)_3$ concentration | | | |
|---|---|---|---|---|
| | 0.001 wt % | 0.01 wt % | 0.05 wt % | 1.0 wt % |
| Oxide layer thickness | 971 Å | 1142 Å | 959 Å | 1016 Å |
| Dishing | −31 Å (reverse dishing) | 26 Å | 51 Å | 0 |
| Erosion | 274 Å | 103 Å | 286 Å | 229 Å |
| Etching | None | None | Small | Large |
| Zeta potential | 4.55 mV | 3.3 mV | −2 mV | −3.09 mV |
| Selectivity | −8.1 | 2.3 | 6.7 | 2.7 |

As suggested in Table 3, dishing was good and less than or equal to approximately 52 Å irrespective of the concentration of the potassium ferrioxalate. Since the primary particle size of zirconia particles having crystallinity is small and approximately 20 nm, the polishing with respect to a tungsten plug and hole, and an isolation oxide layer is uniformly and rapidly performed, and the dishing is formed less. When the concentration of the potassium ferrioxalate was approximately 0.001 wt %, the dishing was about −30 Å and reverse dishing was exhibited, and when the concentration was approximately 0.01 wt %, the dishing was approximately 26 Å. In addition, the dishing was approximately 51.3 Å, which was the greatest value at the concentration of approximately 0.05 wt %, and the dishing was not generated at the concentration of approximately 1.0 wt %. The generating tendency of the dishing may be related to the polishing selectivity. When the concentration of the potassium ferrioxalate was approximately 0.001 wt %, the polishing selectivity was approximately −8.1, and the polishing rate of the oxide layer was greater than that of the tungsten. That is, reverse selectivity was shown. That is, since the polishing rate of the oxide layer was greater than that of the tungsten, the reverse dishing was generated. When the concentration of the potassium ferrioxalate was approximately 0.01 wt %, the polishing selectivity was relatively low and approximately 2.3. Since the polishing rate difference between tungsten and oxide layer was not much great, the dishing was not much great and approximately 26 Å. When the concentration of the potassium ferrioxalate was approximately 0.05 wt %, the polishing selectivity was the highest and approximately 6.7. This result was obtained because the polishing rate of the tungsten was even higher than that of the oxide layer. As a result, the dishing was the greatest and approximately 51 Å. When the concentration of the potassium ferrioxalate was the highest and approximately 1.0 wt %, the polishing selectivity was the smaller and approximately 2.7, and the dishing was not generated.

That is, the dishing was small at the low selectivity in the range of approximately 0.01-1.0 wt %, the dishing was increased at the high selectivity at approximately 0.05 wt %, and the reverse dishing was exhibited at the reverse selectivity at approximately 0.001 wt %.

Figure 18A:
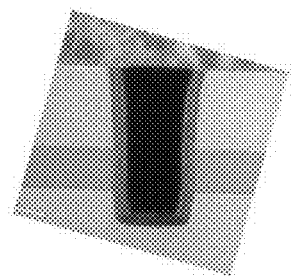
FIGS. 18A to 18D are TEM photographic images after polishing tungsten with respect to the concentration of a potential modulator.
Figure 18B:
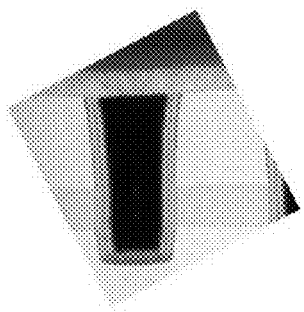
Figure 18C:
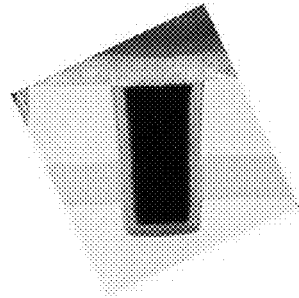
Figure 18D:
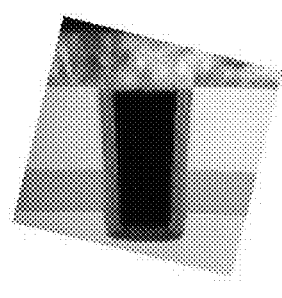

In addition, when the etching of the tungsten surface was examined, the etching was not observed at the surface of the tungsten with the concentration of the potassium ferrioxalate of approximately 0.001-0.01 wt % as shown in FIGS. 18A and 18B. However, etching was observed at the concentration of approximately 0.05 wt % as shown in FIG. 18C, and more serious etching was observed at the concentration of approximately 1.0 wt % as shown in FIG. 18D when compared to that at approximately 0.05 wt %. This observation may be explained in relation to the zeta potential of the slurry. When observing the tungsten pourbaix diagram in FIG. 6, tungsten forms tungsten oxide from positive zeta potential to small negative zeta potential at the pH region of approximately 2.3. At the negative zeta potential lower than the smallest limit, the tungsten oxide was not formed. When the concentration of the potassium ferrioxalate is approximately 0.001-0.01 wt %, the zeta potential of the abrasive particles of the slurry is a positive value, and the tungsten oxide may have weak negative zeta potential when polishing using a slurry satisfying these conditions. This region is a tungsten oxide forming region on the pourbaix diagram, and etching is not generated. On the contrary, since the zeta potential of the abrasive particles of the slurry including the potassium ferrioxalate by the concentration of approximately 0.05-1.0 wt % has a negative value, the zeta potential of the tungsten oxide has a great negative value when performing polishing. This range is deviated from the forming region of the tungsten oxide, and the tungsten oxide is not formed in these conditions, and etching is not generated.

Figure 19:
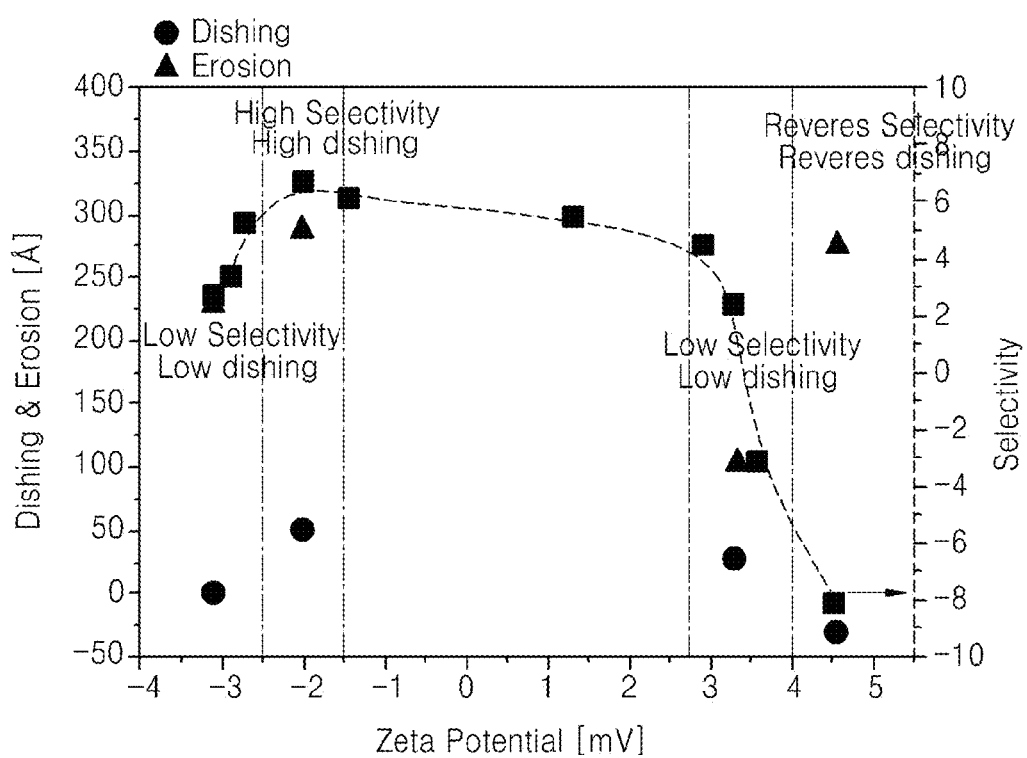
FIG. 19 is a graph illustrating dishing, erosion and polishing selectivity with respect to zeta potential.

FIG. 19 is a graph illustrating dishing, erosion and polishing selectivity with respect to zeta potential. The zeta potential of a slurry including approximately 0.001 wt % of the potassium ferrioxalate is approximately 4.55 mV, and the slurry has reverse selectivity and generates reverse dishing. When the concentration of the potassium ferrioxalate is approximately 0.01 wt %, the zeta potential is approximately 3.3 mV, and the slurry has low selectivity and a small dishing value. When the concentration of the potassium ferrioxalate is approximately 0.05 wt %, the zeta potential is approximately −2 mV, and the slurry has high selectivity and the greatest dishing value. When the concentration of the potassium ferrioxalate is approximately 1.0 wt %, the zeta potential is approximately −3.09 mV, and the slurry has low selectivity and dishing is hardly generated. However, etching is generated.

The slurry in accordance with an exemplary embodiment may be used in a polishing process of tungsten in the manufacturing process of a semiconductor device. Tungsten may be used for forming a buried gate and a wiring/plug. The cell gap is narrow and approximately less than or equal to approximately 30 nm for the buried gate tungsten, and the cell gap is relatively wide and approximately 30-150 nm for the tungsten for the wiring/plug. Therefore, a polishing process may be performed by selecting a slurry having appropriate polishing selectivity according to the kind of the pattern to be polished. That is, the manufacturing process of a semiconductor device may be performed by using a slurry having high reverse selectivity in which the polishing selectivity of an oxide layer is higher than that of a tungsten layer, a slurry having low selectivity in which the polishing selectivity of a tungsten layer and an oxide layer is small, and a slurry having high selectivity in which the polishing selectivity of a tungsten layer and an oxide layer is high. A method of manufacturing a semiconductor device using the slurry in accordance with an exemplary embodiment will be explained referring to FIGS. 20A to 22B.

Figure 20A:
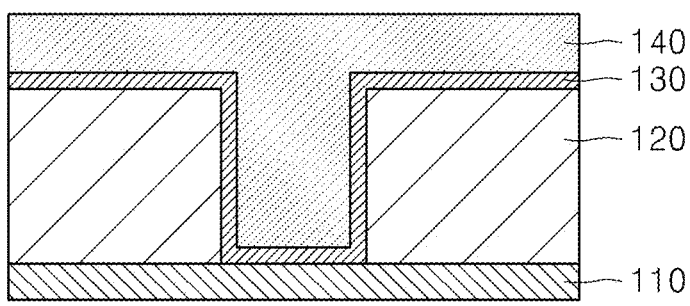
FIGS. 20A to 20C are cross-sectional views for explaining a method of manufacturing a semiconductor device in accordance with an exemplary embodiment.
Figure 20B:
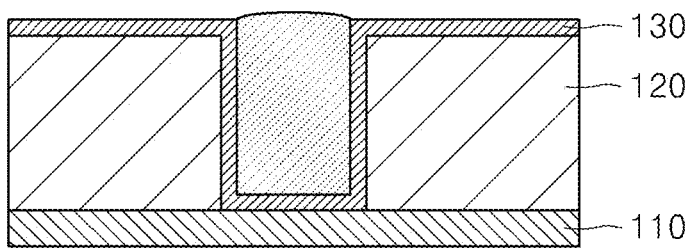
Figure 20C:
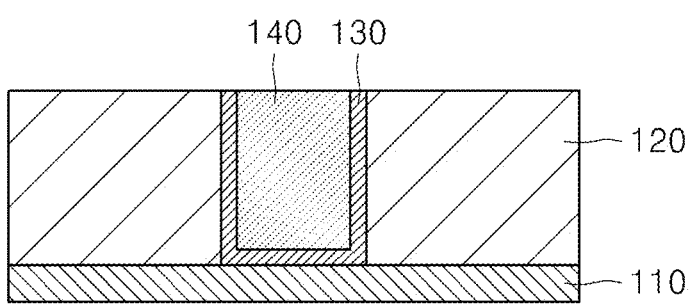

FIGS. 20A to 20C are cross-sectional views for explaining a method of manufacturing a semiconductor device in accordance with an exemplary embodiment, and for explaining a polishing method of tungsten using a slurry having reverse selectivity.

Referring to FIG. 20A, an insulating layer 120 is formed on a substrate 110, and a certain area of the insulating layer 120 is etched to form a pattern exposing a certain area of the substrate 110. The substrate 110 may use various substrates used for the manufacture of a semiconductor device, and may be a silicon substrate. The insulating layer 120 may be formed by using an oxide layer-based material. For example, at least one selected from boronphosphosilicate glass (BPSG), phosphosilicate glass (PSG), high density plasma (HDP), tetraethyl orthosilicate (TEOS), undoped silica glass (USG), PETEOS, and high aspect ratio process (HARP) may be used. In addition, the insulating layer 120 may be formed by using a physical vapor deposition (PVD) method, a chemical vapor deposition (CVD) method, a metal organic CVD (MOCVD) method, an atomic layer deposition (ALD) method, or an AL-CVD method by mixing the CVD method and the ALD method. The pattern may be a hole or a trench having a line shape for exposing a certain area of the substrate 110 and for forming a wiring and/or plug. On the substrate 110 and the insulating layer 120 including the pattern, a barrier layer 130 using such as titanium nitride, etc. is formed and a tungsten layer 140 for burying the pattern is formed.

Referring to FIG. 20B, the tungsten layer 140 is polished by using a slurry having reverse selectivity, in which the polishing selectivity of an oxide layer is higher than that of tungsten. For example, the tungsten layer is polished by using a slurry having a polishing selectivity of a tungsten layer and an oxide layer of approximately 1:1 to 1:8, that is, approximately 0 to −8. In this case, the zeta potential of the slurry, that is, the zeta potential of the abrasive is approximately 3.5-4.6 mV. In the case that the tungsten layer 140 is polished using such a slurry having the reverse selectivity, reverse dishing (A) by which the upper portion of the tungsten layer 140 is higher than the surface of the insulating layer 120 or the barrier layer 130 may be generated.

Referring to FIG. 20C, the tungsten layer 140 is polished by using a slurry having an appropriate selectivity, in which the polishing selectivity of a tungsten layer is higher than that of an oxide layer. That is, the tungsten layer 140 is polished by using a slurry having the polishing selectivity of a tungsten layer and an oxide layer of approximately greater than or equal to 1:1, that is, a slurry having a polishing selectivity of approximately 1-6 or a slurry having a polishing selectivity of greater than or equal to approximately 6. Then, the reverse dishing (A) of the tungsten layer 140 is removed, and a pattern having no dishing and erosion may be obtained.

Figure 21A:
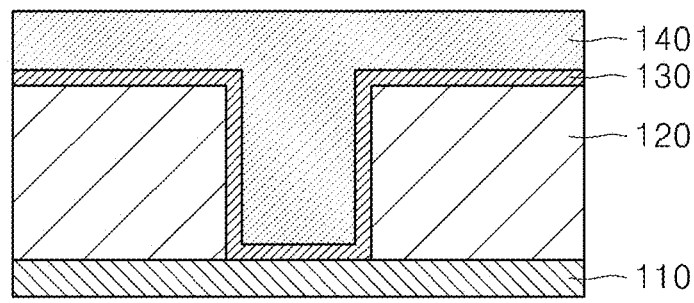
FIGS. 21A and 21B are cross-sectional views for explaining a method of manufacturing a semiconductor device in accordance with another exemplary embodiment.
Figure 21B:
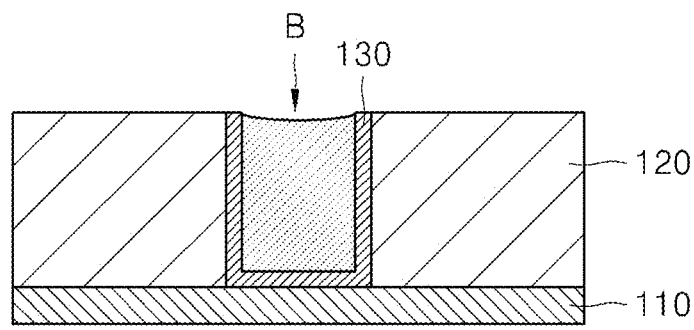

FIGS. 21A and 21B are cross-sectional views for explaining a method of manufacturing a semiconductor device in accordance with another exemplary embodiment, and for explaining a polishing method of tungsten using a slurry having high selectivity.

Referring to FIG. 21A, an insulating layer 120 is formed on a substrate 110, and a certain area of the insulating layer 120 is etched to form a pattern exposing a certain area of the substrate 110. The pattern may be a hole exposing a certain area of the substrate 110 for forming a buried gate electrode.

On the substrate 110 and the insulating layer 120 including the pattern, a barrier layer 130 is formed using titanium nitride, etc., and a tungsten layer 140 is formed to bury the pattern.

Referring to FIG. 21B, the tungsten layer 140 and the insulating layer 120 are polished using a slurry having high selectivity, in which the polishing selectivity of a tungsten layer and an oxide layer is high. In this case, the slurry has polishing selectivity of a tungsten layer and an oxide layer of greater than or equal to approximately 6:1, that is, greater than or equal to approximately 6. The zeta potential of the slurry, that is, the zeta potential of an abrasive is approximately −2 mV to approximately 2 mV. When the tungsten layer 140 is polished by using a slurry having high selectivity, the insulating layer 120 is not polished, however the tungsten layer 140 is polished. Thus, erosion is hardly generated, however dishing (B) may be generated a little. However, since the buried gate has a narrow cell gap, the dishing is prevented, and the slurry having high selectivity is appropriate for polishing the buried gate tungsten.

Figure 22A:
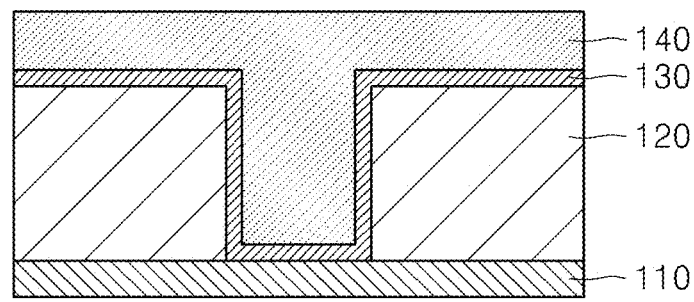
FIGS. 22A and 22B are cross-sectional views for explaining a method of manufacturing a semiconductor device in accordance with still another exemplary embodiment.
Figure 22B:
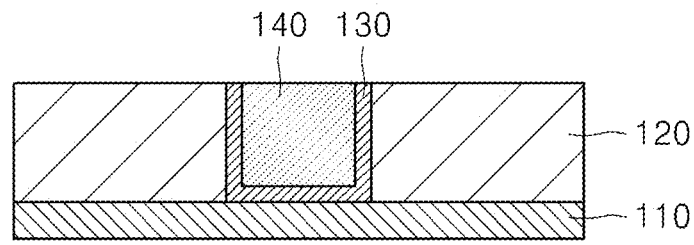

FIGS. 22A and 22B are cross-sectional views for explaining a method of manufacturing a semiconductor device in accordance with still another exemplary embodiment, and for explaining a polishing method of tungsten using a slurry having low selectivity.

Referring to FIG. 22A, an insulating layer 120 is formed on a substrate 110, and a certain area of the insulating layer 120 is etched to form a pattern exposing a certain area of the substrate 110. The pattern may be a hole or a trench of a line shape for exposing a certain area of the substrate 110 and for forming a wiring and/or a plug. On the substrate 110 and the insulating layer 120 including the pattern, a barrier layer 130 is formed using titanium nitride, etc., and a tungsten layer 140 is formed to bury the pattern.

Referring to FIG. 22B, the tungsten layer 140 and the insulating layer 120 are polished by using a slurry having low selectivity, in which the polishing selectivity of a tungsten layer and an oxide layer is low. In this case, the slurry has a polishing selectivity of a tungsten layer and an oxide layer of approximately 1:1 to 6:1, that is, approximately 1-6. The zeta potential of the slurry, that is, the zeta potential of the abrasive is approximately 2-3.5 mV and approximately −2 mV. In the case that the tungsten layer 140 is polished by using a slurry having low selectivity, the insulating layer 120 and the tungsten layer 140 may be polished to almost the same thickness. In this case, dishing may not be generated, however erosion may be generated a little.

According to an exemplary embodiment, tungsten may be polished by directly contacting and using an abrasive of which zeta potential is controlled within an appropriate range, and a polishing process by which tungsten polishing rate is largely increased, and the polishing selectivity of tungsten and an insulating layer is good may be performed.

In addition, the zeta potential may be controlled by controlling the concentration of a dispersing agent and a potential modulator, and diverse polishing selectivities may be realized. That is, the polishing selective may be controlled in a wide range from the large polishing selectivity of a tungsten layer and an insulating layer to the reverse polishing selectivity thereof. Thus, dishing and erosion may be decreased, and the generation of by-products may be decreased.

Slurries having diverse properties may be easily prepared, and an eco-friendly polishing process may be possible by using an eco-friendly material.

In addition, tungsten may be effectively polished by performing a simple polishing process, the operating properties and the reliability of a semiconductor device may be improved, and the manufacturing productivity may be increased.

Although the polishing slurry and the substrate polishing method using the same have been described with reference to the specific embodiments, they are) not limited thereto. Therefore, it will be readily understood by those skilled in the art that various modifications and changes can be made thereto without departing from the spirit and scope of the present invention defined by the appended claims.

What is claimed is:

1. A polishing slurry for tungsten, comprising:
an abrasive for performing polishing; and
a potential modulator for controlling the zeta potential of the abrasive,
wherein the potential modulator comprises potassium ferrioxalate, and
wherein the zeta potential of the abrasive is +5 mV to −5 mV, and the polishing selectivity of the tungsten and an insulating layer is 1:1 to 1:8, or 1:1 to 2:1, or 6:1 or more.

2. The polishing slurry of claim 1, wherein the abrasive comprises zirconia particles.

3. The polishing slurry of claim 2, wherein the abrasive is comprised by greater than approximately 0.2 wt % to less than or equal to approximately 10 wt % based on a total amount of the slurry.

4. The polishing slurry of claim 2, wherein the potential modulator controls the zeta potential of the abrasive by generating anions, and the potential modulator is comprised by approximately 0.001-1 wt % based on a total amount of the slurry.

5. The polishing slurry of claim 4, wherein the zeta potential of the abrasive is approximately 5-3.5 mV, and the polishing selectivity of the tungsten and the insulating layer is approximately 1:1 to 1:8.

6. The polishing slurry of claim 4, wherein the zeta potential of the abrasive is approximately −2 mV to approximately 2 mV, and the polishing selectivity of the tungsten and the insulating layer is greater than or equal to approximately 6:1.

7. The polishing slurry of claim 4, wherein the zeta potential of the abrasive is approximately 2-3.5 mV and less than or equal to approximately −2 mV, and the polishing selectivity of the tungsten and the insulating layer is approximately 1:1 to 2:1.

8. The polishing slurry of claim 1, further comprising a dispersing agent for dispersing the abrasive and for controlling the zeta potential of the abrasive to a smaller quantity than that of the potential modulator.

9. The polishing slurry of claim 8, wherein the dispersing agent comprises an anionic, cationic and nonionic polymer material.

10. The polishing slurry of claim 9, wherein
the anionic polymer material comprises at least one selected from the group consisting of polyacrylic acid, polycarboxylic acid, sodium dodecyl benzenesulfonate, sodium dodecyl sulfate, and sodium polystyrene sulfonate,
the cationic polymer material comprises at least one selected from the group consisting of polylysine, polyethyleneimine, benzethonium chloride, bronidox, cetrimonium bromide, cetrimonium chloride, dimethyldioctadecylammonium chloride, tetramethylammonium hydroxide, distearyl dimethyl ammonium chloride, polydimethylamine-co-epichlorohydrin, 1,2-dioleoyl-3-trimethylammonium propane, and poly allyl amine, and the nonionic polymer material comprises at least one selected from the group consisting of polyvinyl pyrrolidone, polyethylene oxide, polyvinyl alcohol, hydroxyethyl cellulose, 2-amino-2-methyl-1-propanol, β-cyclodextrin, fructose, glucose, and galactose.

11. The polishing slurry of claim 9, wherein the dispersing agent is comprised by greater than approximately 0.001 wt % to less than or equal to 1 wt % based on a total amount of the slurry.

12. The polishing slurry of claim 8, further comprising an oxidant for oxidizing a surface of the tungsten.

13. The polishing slurry of claim 12, wherein the oxidant comprises at least one selected from the group consisting of hydrogen peroxide, carbamide peroxide, ammonium persulfate, ammonium thiosulfate, sodium hypochlorite, sodium periodate, sodium persulfate, potassium iodate, potassium perchlorate and potassium persulfate.

14. The polishing slurry of claim 12, wherein the oxidant is comprised by approximately 0.5-5 wt % based on a total amount of the slurry.

15. The polishing slurry of claim 1, further comprising a pH control agent for controlling pH of the slurry.

16. The polishing slurry of claim 15, wherein the pH of the slurry is less than or equal to 4.

17. A polishing slurry for tungsten, comprising:
an abrasive for performing polishing and having crystallinity;
a potential modulator for promoting oxidation of the tungsten and for controlling a zeta potential of the abrasive; and
a dispersing agent for dispersing the abrasive,
wherein the potential modulator comprises potassium ferrioxalate and
wherein the abrasive has the zeta potential from approximately 5 mV to approximately −5 mV, and the polishing selectivity of the tungsten and an insulating layer is 1:1 to 1:8, or 1:1 to 2:1, or 6:1 or more.

18. The polishing slurry of claim 17, wherein the abrasive comprises zirconia particles having an average particle size of primary particles of approximately 10-100 nm.

19. The polishing slurry of claim 18, wherein the potential modulator is comprised by approximately 0.001-1 wt % based on a total amount of the slurry.

20. The polishing slurry of claim 19, wherein polishing selectivity of the tungsten and an insulating layer is approximately 1:8 to 10:1.

* * * * *